(12) United States Patent
Sullivan

(10) Patent No.: US 7,600,607 B2
(45) Date of Patent: Oct. 13, 2009

(54) FLOW-THROUGH SOUND-CANCELLING MUFFLERS

(76) Inventor: John Timothy Sullivan, 11339 Barley Field Way, Marriottsville, MD (US) 21104-1346

( * ) Notice: Subject to any disclaimer, the term of this patent is extended or adjusted under 35 U.S.C. 154(b) by 191 days.

(21) Appl. No.: 11/280,174

(22) Filed: Nov. 17, 2005

(65) Prior Publication Data

US 2007/0107982 A1 May 17, 2007

(51) Int. Cl.
*F01N 1/06* (2006.01)
(52) U.S. Cl. .................. 181/250; 181/273; 181/276; 181/278; 181/279
(58) Field of Classification Search .............. 181/232, 181/247, 248, 250, 273, 276, 278, 279, 280
See application file for complete search history.

(56) References Cited

U.S. PATENT DOCUMENTS

| | | | | |
|---|---|---|---|---|
| 806,714 A * | 12/1905 | Porter | | 181/265 |
| 1,601,137 A * | 9/1926 | Maxim | | 181/279 |
| 1,611,475 A * | 12/1926 | Maxim | | 181/249 |
| 1,866,004 A * | 7/1932 | Beamer | | 181/265 |
| 2,600,262 A * | 6/1952 | Powers | | 96/385 |
| 3,073,684 A * | 1/1963 | Williams, Sr. | | 422/175 |
| 3,672,464 A * | 6/1972 | Rowley et al. | | 181/253 |
| 3,700,069 A * | 10/1972 | Rausch et al. | | 181/227 |
| 3,754,620 A * | 8/1973 | Foster et al. | | 181/265 |
| 3,786,896 A * | 1/1974 | Foster et al. | | 181/265 |
| 3,913,703 A * | 10/1975 | Parker | | 181/206 |
| 4,172,508 A * | 10/1979 | Moss et al. | | 181/265 |
| 4,220,219 A * | 9/1980 | Flugger | | 181/265 |
| 4,315,559 A * | 2/1982 | Casey | | 181/265 |
| 4,361,206 A * | 11/1982 | Tsai | | 181/255 |
| 4,424,882 A * | 1/1984 | Moller | | 181/231 |
| 4,450,932 A * | 5/1984 | Khosropour et al. | | 181/211 |
| 4,579,195 A * | 4/1986 | Nieri | | 181/279 |
| 4,645,521 A * | 2/1987 | Freesh | | 55/309 |
| 4,779,703 A * | 10/1988 | Takiguchi et al. | | 181/228 |
| 4,809,812 A * | 3/1989 | Flugger | | 181/268 |
| 4,913,597 A * | 4/1990 | Christianson et al. | | 406/39 |
| 5,174,113 A * | 12/1992 | Deville | | 60/309 |
| 5,196,653 A * | 3/1993 | Kiss | | 181/224 |
| 5,245,140 A * | 9/1993 | Wu | | 181/232 |
| 5,245,933 A * | 9/1993 | Childs | | 110/214 |
| 5,314,009 A * | 5/1994 | Yates et al. | | 165/72 |

(Continued)

*Primary Examiner*—Jeffrey Donels
*Assistant Examiner*—Jeremy Luks
(74) *Attorney, Agent, or Firm*—Bacon & Thomas, PLLC

(57) ABSTRACT

A sound-cancelling flow-through muffler includes a linear first inner passage, and a curved or zig-zagged second outer passage that wraps around or surrounds the inner passage and that is situated between the linear first inner passage and an exterior wall of the muffler. The outer passage has a length that is equal to, or a multiple of, one-half the wavelength of sound to be cancelled by the muffler such that sound exiting the inner and outer passages destructively interferes or cancels in a sound cancellation or conversion chamber. In addition, the walls of the outer passage serve as a heat sink to extract heat from the exhaust stream and conduct the heat to the outside of the housing. Alternatively, the outer passage may have a closed such that reflects sound back toward the inner passage for cancellation, the walls of the outer passage continuing to serve as a heat sink to extract heat from the exhaust stream and conduct the heat to the outside of the housing.

12 Claims, 11 Drawing Sheets

U.S. PATENT DOCUMENTS

| | | | | |
|---|---|---|---|---|
| 5,444,197 A * | 8/1995 | Flugger | | 181/264 |
| 5,530,214 A * | 6/1996 | Morehead et al. | | 181/255 |
| 5,821,475 A * | 10/1998 | Morehead et al. | | 181/255 |
| 5,952,625 A * | 9/1999 | Huff | | 181/265 |
| 5,968,456 A * | 10/1999 | Parise | | 422/174 |
| 6,089,347 A * | 7/2000 | Flugger | | 181/264 |
| 6,109,026 A * | 8/2000 | Karlsson et al. | | 60/302 |
| 6,220,387 B1 * | 4/2001 | Hoppes et al. | | 181/259 |
| 6,296,074 B1 * | 10/2001 | Ridlen | | 181/272 |
| 6,364,054 B1 * | 4/2002 | Bubulka et al. | | 181/264 |
| 6,364,055 B1 * | 4/2002 | Purdy | | 181/279 |
| 6,595,319 B1 * | 7/2003 | Huff | | 181/250 |
| 6,702,190 B1 * | 3/2004 | Nohl et al. | | 237/12.3 C |
| 6,769,511 B1 * | 8/2004 | Brooks et al. | | 181/241 |
| 2003/0223919 A1 * | 12/2003 | Kwak et al. | | 422/174 |
| 2004/0000448 A1 * | 1/2004 | Santos | | 181/251 |
| 2005/0011700 A1 * | 1/2005 | Dadd | | 181/279 |

* cited by examiner

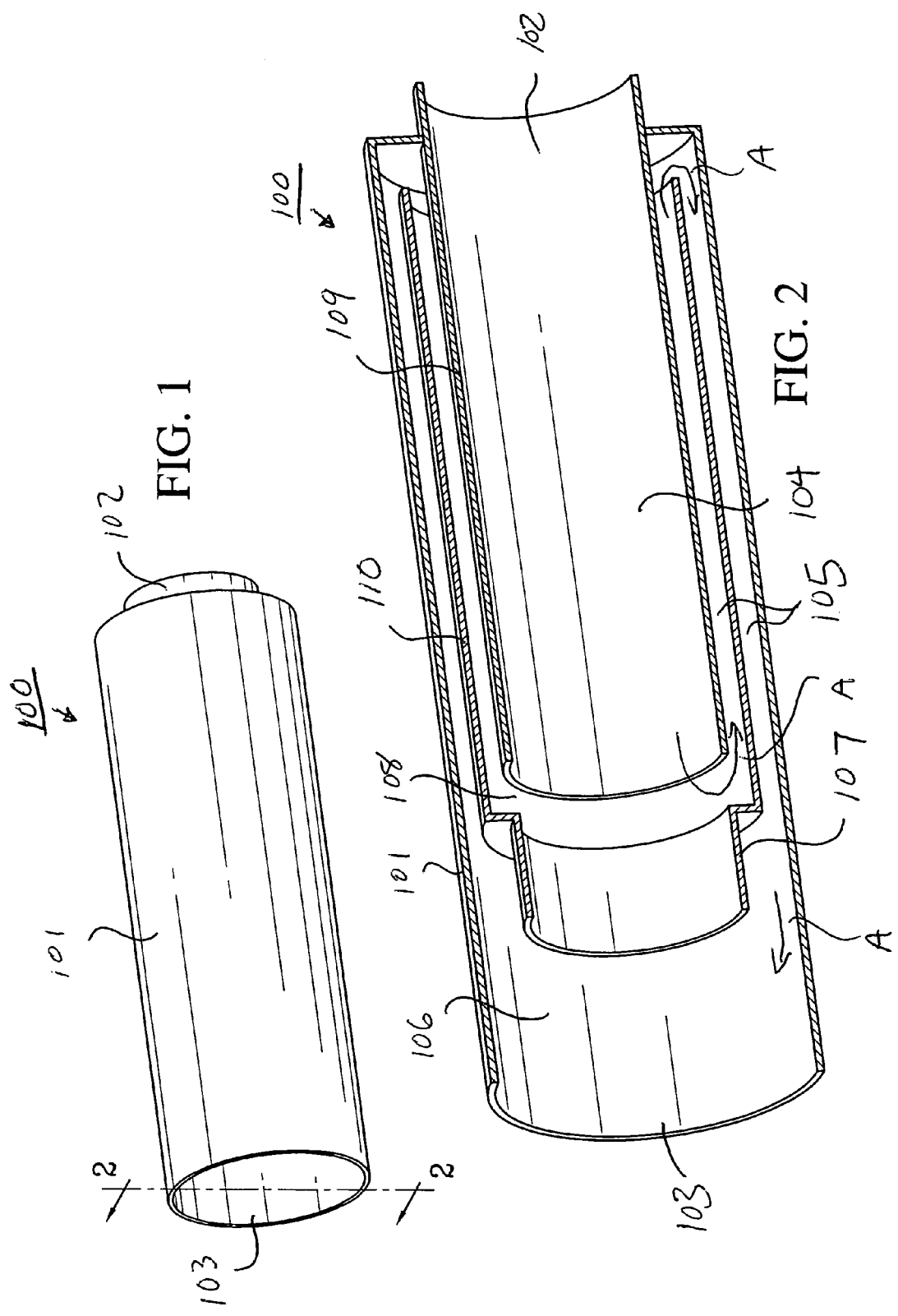

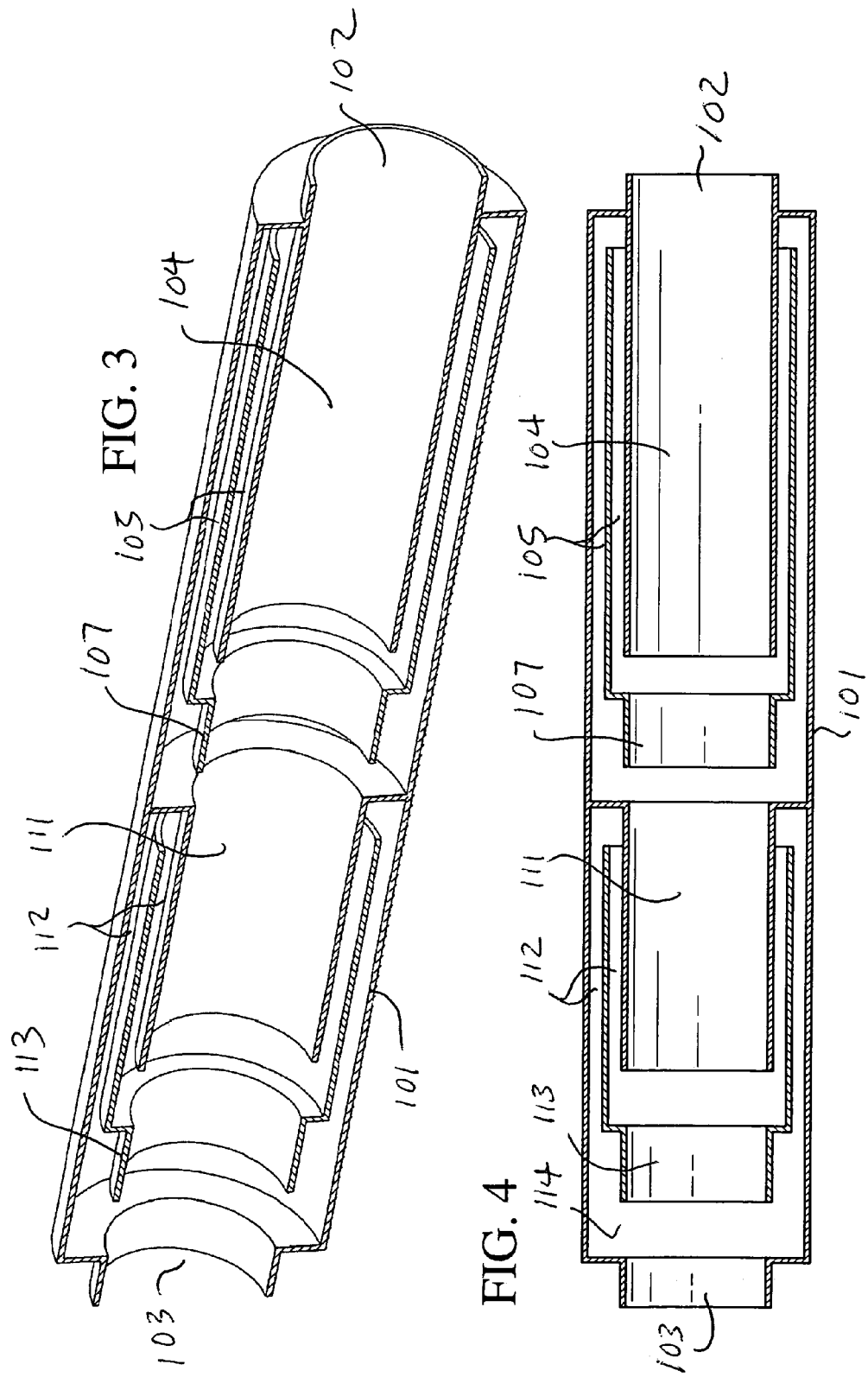

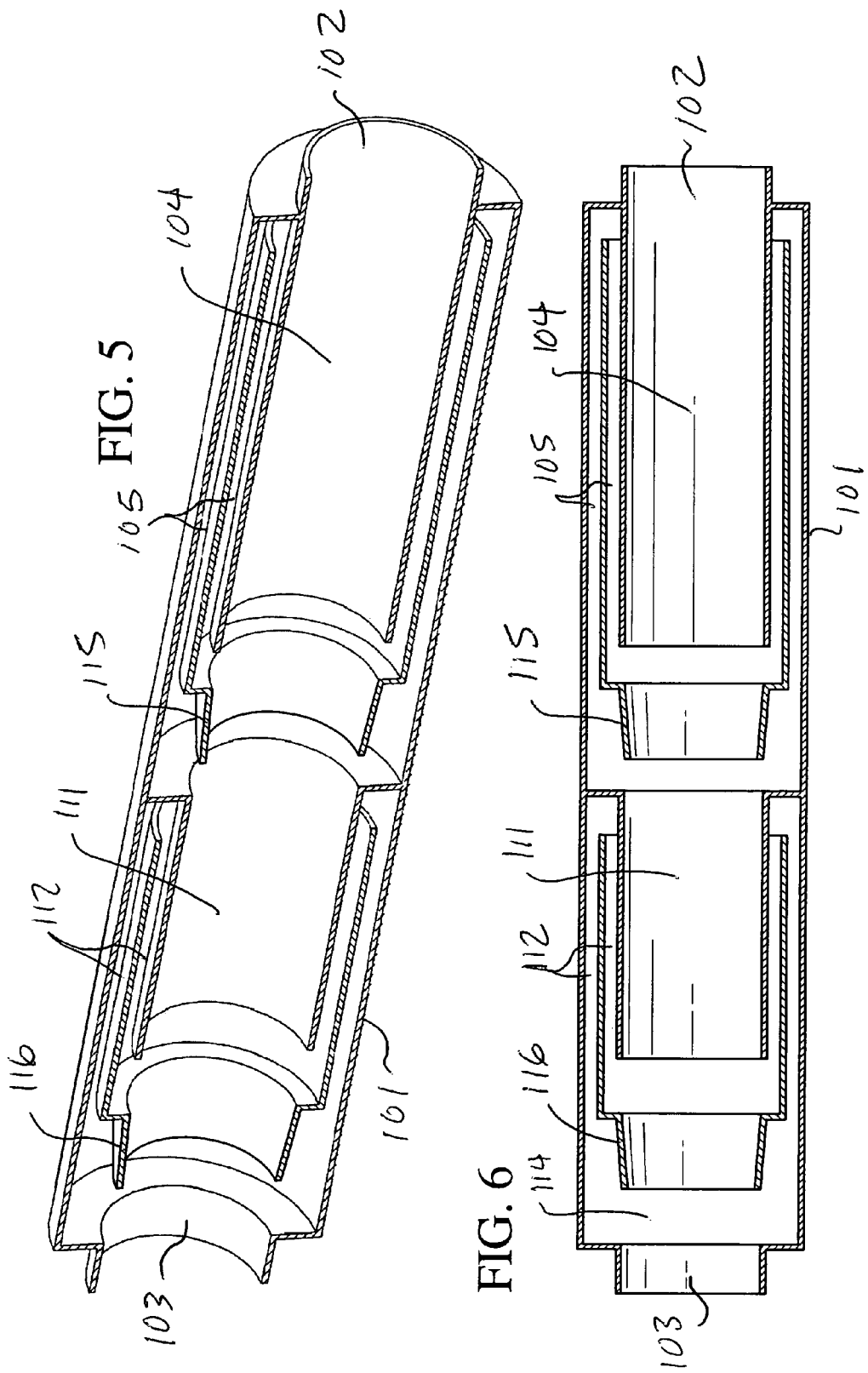

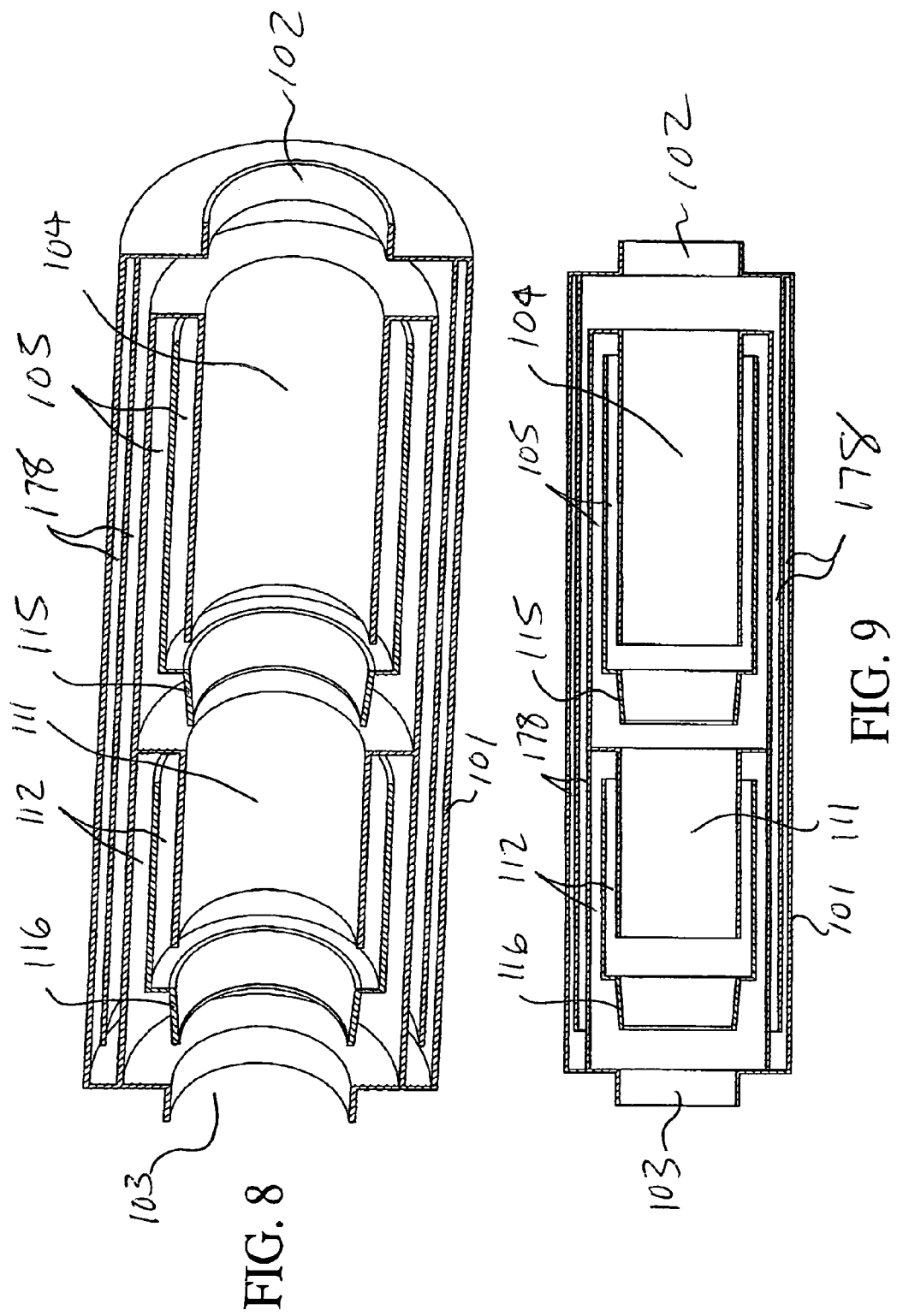

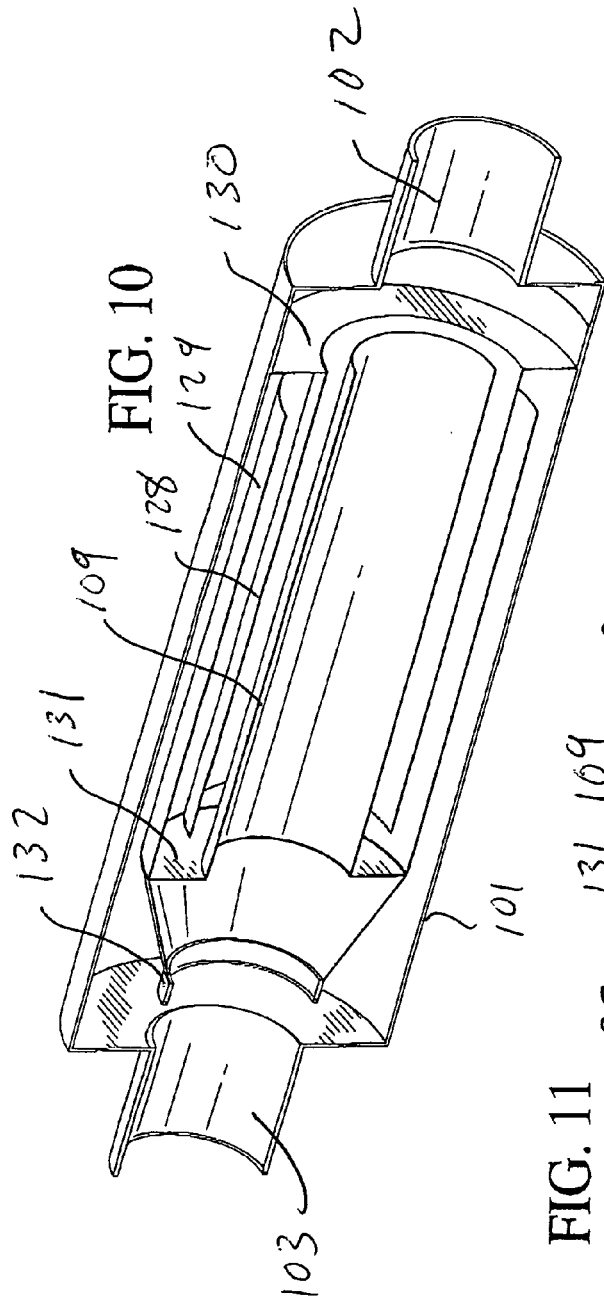
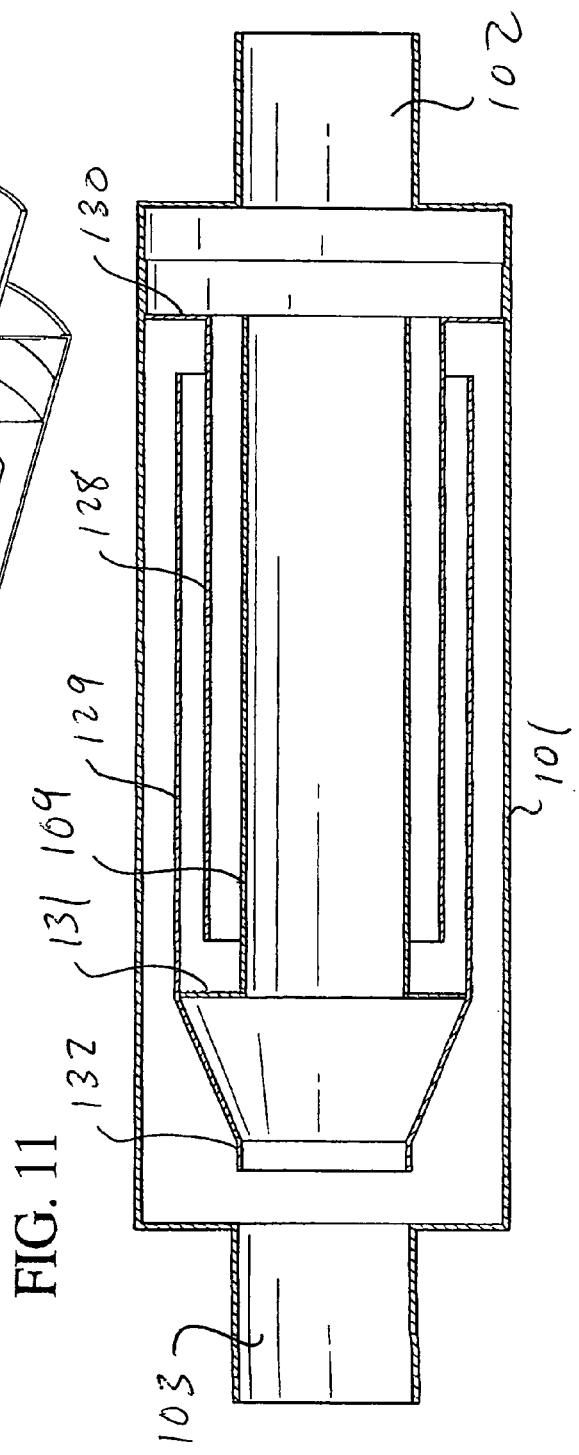
FIG. 10
FIG. 11

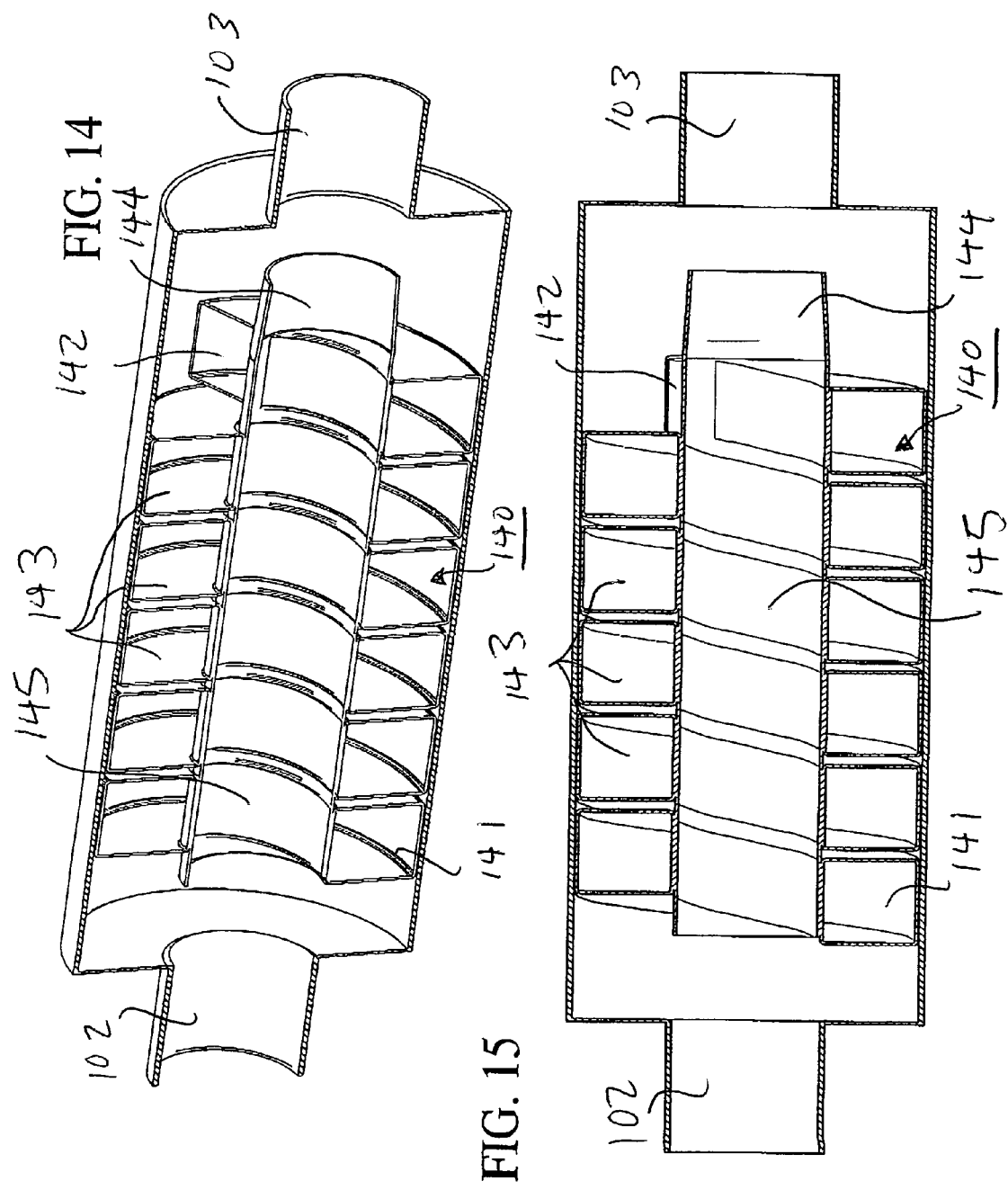

FLOW-THROUGH SOUND-CANCELLING MUFFLERS

BACKGROUND OF THE INVENTION

1. Field of the Invention

This invention relates to mufflers, and in particular to high efficiency, sound-cancelling flow-through mufflers arranged to reduce fuel consumption by decreasing back-pressure and therefore load on an engine.

In a first set of preferred embodiments, the mufflers feature a linear inner passage and a curved or zig-zag shaped outer passage that wraps around or surrounds the inner passage and is situated between the inner passage and an exterior wall of the muffler. The outer passage has a length that equals one-half the wavelength of sound to be canceled, or multiples of one-half wavelength, such that sound waves exiting the outer passage destructively interferes with or cancels sound waves directly exiting the inner passage to a sound-cancellation or conversion chamber at the outlet of the passages.

In a second set of preferred embodiments, the mufflers feature a linear inner passage and a curved or zig-zag shaped outer passage that wraps around or surrounds the inner passage and is situated between the inner passage and the exterior wall of the muffler, and that has a length equaling one-quarter the wavelength of sound to be cancelled, or multiples of the quarter wavelength, such that sound waves propagating in the outer passage and reflected from an end of the outer passage cancel sound waves propagating in the inner passage.

In each of the sets of preferred embodiments, the walls of the inner and outer passages are arranged to extract heat from exhaust gases in the passages, and to conduct the heat to an exterior surface of the muffler. The heat conducted to the exterior surface of the muffler may be advantageously be used for electricity generation, according to the principles described in copending U.S. patent application Ser. No. 10/211,701, filed Aug. 26, 2005, or for other purposes such as in a reformer that converts hydrocarbons such as diesel fuel into hydrogen gas.

In order to draw exhaust gases through the outer passage, the inner passage may have a Venturi nozzle that opens into the sound cancellation conversion chamber, thereby increasing the rate of heat extraction from the exhaust stream.

2. Description of Related Art

Noise silencing mufflers are well-known for reducing the volume of sound that accompanies the flow of exhaust gases from an internal combustion engine. The most commonly-used type of muffler incorporates a sound absorbing material through which exhaust gases are passed. However, the material through which the gases are passed inherently cause back-pressure to be exerted on the engine. Excess back-pressure increases fuel consumption and decreases engine performance.

To decrease back-pressure on the engine and increase efficiency, it is also known to provide mufflers which incorporate circuitous passages that isolate and attenuate sound waves generated by the exhaust stream, rather than relying on sound absorbing materials. In order to minimize turbulence or eddy currents that increase back pressure and noise, many of the circuitous passage designs divide the incoming exhaust stream into multiple paths, and converge the paths at the outlet.

Examples of flow-through mufflers with circuitous passages are disclosed in U.S. Pat. Nos. 3,786,896; 4,809,812; 5,444,197; 6,364,054; and 6,296,074. Of particular interest are U.S. Pat. No. 6,364,054, which discloses a muffler having expansion chambers and reduced openings that decrease sound volume by conversion of a part of the sound energy to heat energy, and which modify the frequency of sound passing through the muffler to provide tuning. Also of particular interest are U.S. Pat. No. 6,089,347, in which various dividers and partitions are arranged so that sound is attenuated in the spaces between the partitions as exhaust gases are directed past the outward ends of the partitions, the lengths of the spaces between the partitions being chosen to tune the muffler to affect selected frequencies, and U.S. Pat. No. 6,296,074, which discloses a sound cancelling muffler, in which the exhaust stream is separated into two different passages having different lengths so that at the point of conversion, the acoustic waves generated by the exhaust gases are out of phase and actually cancel, as opposed to merely being attenuated.

While these flow-through mufflers have the effect of reducing back-pressure on the engine, however, they are relatively expensive to manufacture and have not achieved widespread use, except in specialty applications. The reason is that they are relatively complicated to construct, and only cancel a limited range of frequencies. The sound cancelling muffler disclosed in U.S. Pat. No. 6,296,074 utilizes an especially complex structure, which not only is expensive to construct but also takes up a relatively large volume.

Like U.S. Pat. No. 6,296,074, the present invention seeks to provide sound cancellation by splitting and converging the exhaust stream in such a way that sound waves propagating in the diverging streams converge out of phase and therefore cancel. However, the invention differs from the arrangement disclosed in U.S. Pat. No. 6,296,074 in that one of the passages is a linear inner passage, and the second passage is an outer passage that wraps around or surrounds the inner passage and that is situated between the inner passage and an exterior wall of the muffler. This arrangement not only provides sound cancellation in a minimal volume with relatively simple structure, but also provides a medium to conduct heat to the exterior of the muffler for use in thermo-electric generation or other purposes.

According to one aspect of the invention, a Venturi nozzle is used to draw exhaust gases through the outer passage, thereby improving heat extraction. The use of Venturi nozzles to manipulate airflow through an enclosed space is of course known, but not in combination with a sound-cancelling muffler. Instead, Venturi nozzles are conventionally used to prevent propagation of acoustic waves past the throat of the nozzle by increasing the speed of the sound waves to sonic levels so that sound can no longer propagate, by reflecting sound waves off the walls of a taper or at the narrow opening, or by reducing pressure fluctuations downstream of the nozzle. Increasing the rate of exhaust gas flow through an outer sound-cancelling passage that wraps around the inner passage is not a consideration.

Examples of silencing devices that utilize Venturi nozzles, but not to draw gases through a heat-extraction passage, include the multiple stage Venturi muffler is disclosed in U.S. Pat. No. 1,611,475, the engine air intake Venturi silencers disclosed in U.S. Pat. Nos. 5,821,475 and 5,530,214, and the exhaust outlet Venturi silencer disclosed in U.S. Pat. No. 5,174,113. In addition, mufflers that use the Venturi effect to cause flow diversion and cancellation of acoustic pressure waves upon recombination are disclosed in U.S. Pat. Nos. 3,672,464 and 4,361,206, and an exhaust muffler that uses the accelerated exhaust gases to cause inflow of outside air is disclosed in U.S. Pat. No. 6,220,387. A final example of a muffler that claims to use a "Venturi" effect is the SpinTech muffler described in the websites [http//www] .off road.com/ford/flashback/spintech/spin.html and galaxieclub.com/spin/ spintech.html, which is said to scavenge exhaust gases by creating a flow increase and trapping sound energy in spiral "sound traps" within the main exhaust passage.

In effect, the present invention represents a combination of the principle of heat conversion taught by the above-cited U.S. Pat. No. 6,364,054 and the sound attenuation or cancellation principles of U.S. Pat. No. 6,089,347, U.S. Pat. No. 6,296,074 and other prior patents, in a way that offers a substantially simplified construction and that enables increased versatility, including the ability to utilize the muffler for electricity generation and even emissions reduction, and to enable the muffler to be more easily arranged to compensate for the different frequencies generated at different engine speeds and loads. None of the prior systems, including those with sound cancellation and those that utilize Venturi nozzles suggests such a combination, or achieves the advantages in terms of simplicity of construction, efficiency, and sound reduction of the present invention.

SUMMARY OF THE INVENTION

It is a first objection of the invention to provide a muffler that reduces engine load.

It is a second objective of the invention to provide a muffler that effectively cancels a broad spectrum exhaust noise frequencies.

It is a third objective of the invention to provide a muffler that may easily be adapted for a particular acoustic profile.

It is a fourth objective of the invention to provide a muffler that provides efficient extraction of heat from the exhaust stream, for use in generating electricity, reforming fuels, and so forth.

It is a fifth objective of the invention to provide a muffler that is simple and inexpensive to construct, and that may be easily adapted to meet any or all of the above objectives.

These objectives are achieved, in accordance with the principles of various preferred embodiments of the invention, by providing a sound-cancelling flow-through muffler having a linear first inner passage, and a curved or zig-zagged second outer passage that wraps around or surrounds the inner passage and that is situated between the linear first inner passage and an exterior wall of the muffler. The outer passage has a length that is equal to, or a multiple of, one-half the wavelength of sound to be cancelled by the muffler such that sound exiting the inner and outer passages destructively interferes or cancels in a sound cancellation or conversion chamber. In addition, the walls of the outer passage serve as a heat sink to extract heat from the exhaust stream and conduct the heat to the outside of the housing.

Alternatively, these objectives are achieved, in accordance with the principles of other preferred embodiments of the invention, by providing a sound-cancelling flow-through muffler having a linear first inner passage, and a curved or zig-zagged second outer passage that wraps around or surrounds the inner passage, and that is situated between the linear first inner passage and an exterior wall of the muffler, the outer passage having a length that is greater than the length of the inner passage by one-quarter of the wavelength of sound to be cancelled, the outer passage being closed such that sound reflects back toward a point of convergence at which destructive interference or cancellation or sound in the inner passage occurs, and the walls of the outer passage serving as a heat sink to extract heat from the exhaust stream and conduct the heat to the outside of the housing.

In each of the preferred embodiments of the invention, the housing of the muffler, and in particular portions of the housing that define the inner and outer passages, may be made of stamped and formed sheet metal. In a particularly advantageous embodiments of the invention, the outer passage forms a spiral or "jelly roll" configuration, the distal end of which is either open to a convergence chamber or closed to reflect sound back to the inner passage. The jelly roll configuration, which may optional include a width that increases with increasing radius to form a spiral volute, maximizes the surface area available for heat extraction, minimizes the overall volume of the muffler, and yet is relatively simple to construct. Alternatively, the outer passage may have a zigzagged wrap-around configuration, or may be helically wrapped around the linear inner passage.

According to a number of preferred embodiments of the invention, exhaust gases may be drawn through the outer passage by a Venturi tube positioned at an outlet to the inner passage. Alternatively, the Venturi effect of gases passing through the inner passage may draw external air or exhaust gases entering from a radially outward side of the outer passage towards the inner passage. Furthermore, multiple sound-cancelling units may be connected in series, parallel, or combinations of series and parallel connections, and of different outer passage configurations, to cancel different frequencies of sound. Such combinations of sound cancelling units may be used to extend the effective sound cancelling range of the preferred mufflers from 10 Hz to 30 kHz.

In order to utilize the heat extraction capabilities of the preferred flow-through mufflers, a heat sink may be provided on the exterior surface of the muffler, the heat sink being thermally connected to one surface of one or more thermo-electric generators, or other device for utilizing the heat, such as a diesel fuel reformer. In the case of thermo-electric generators, a heat exchanger must be connected to a second surface of the generator units and separated from the heat sink by an insulator so as to create a heat differential between opposite sides of the generator units as disclosed, for example, in the above-cited copending U.S. patent application Ser. No. 11/211,701. In addition, the wall of the passages through which heat is extracted may be coated with a catalyst to reduce pollutants in the exhaust stream and enhance heat extraction.

As explained in the copending application, the path length difference in feet that is required to achieve sound cancellation for an internal combustion engine (i.e., a path length difference of half a wavelength) is 1875 multiplied by the number of cylinders, and divided by the speed of the engine in revolutions per minute (RPM) and the number of revolutions per firing of each cylinder, or 7500/RPM for an eight cylinder engine with two revolutions between firings. As a result, if the outer passage has an open-ended configuration, a three foot outer passage length is all that is required to cancel sound at 2500 RPM, while a closed-ended configuration only requires a 1.5 foot outer passage length. These are well within the footprint of an ordinary vehicular muffler. On the other hand, those skilled in the art will also appreciate that the invention is not limited to use on vehicles, or even to internal combustion engines, but rather may be applied to any system that generates an exhaust stream or flow of hot gases, including smoke stacks or steam generators, and to numerous other systems requiring sound cancellation, including military systems such as a tank turret, and involving audible frequencies ranging from 10 Hz to 30 kHz, or even extra-audible frequencies.

BRIEF DESCRIPTION OF THE DRAWINGS

FIG. 1 is an isometric view of a flow-through sound cancelling muffler constructed in accordance with the principles of a first preferred embodiment of the invention.

FIG. 2 is a cut-away isometric view of the muffler of FIG. 1.

FIG. 3 is a cut-away isometric view of a two-stage version of the muffler illustrated in FIGS. 1 and 2.

FIG. 4 is a cross-sectional side view of the muffler of FIG. 3.

FIG. 5 is a cut-away isometric view of a variation of the two-stage muffler of FIGS. 3 and 4 having tapered or cone-shaped Venturi tubes.

FIG. 6 is a cross-sectional side view of the muffler of FIG. 5.

FIG. 8 is a cut-away isometric views of a variation of the mufflers of FIGS. 5 and 6, having an additional outer passage.

FIG. 9 is a cross-sectional side view of the muffler of FIG. 8.

FIG. 10 is a cut-away isometric view of a variation of the muffler of FIGS. 1 and 2, in which the outer passage is doubled in length.

FIG. 11 is a cross-sectional side view of the muffler of FIG. 10.

FIG. 14 is a cut-away isometric view of a muffler having a spiral outer passage, in accordance with the principles of a second preferred embodiment of the invention.

FIG. 15 is a cross-sectional side view of the muffler of FIG. 14.

DETAILED DESCRIPTION OF THE PREFERRED EMBODIMENTS

Figure 7:
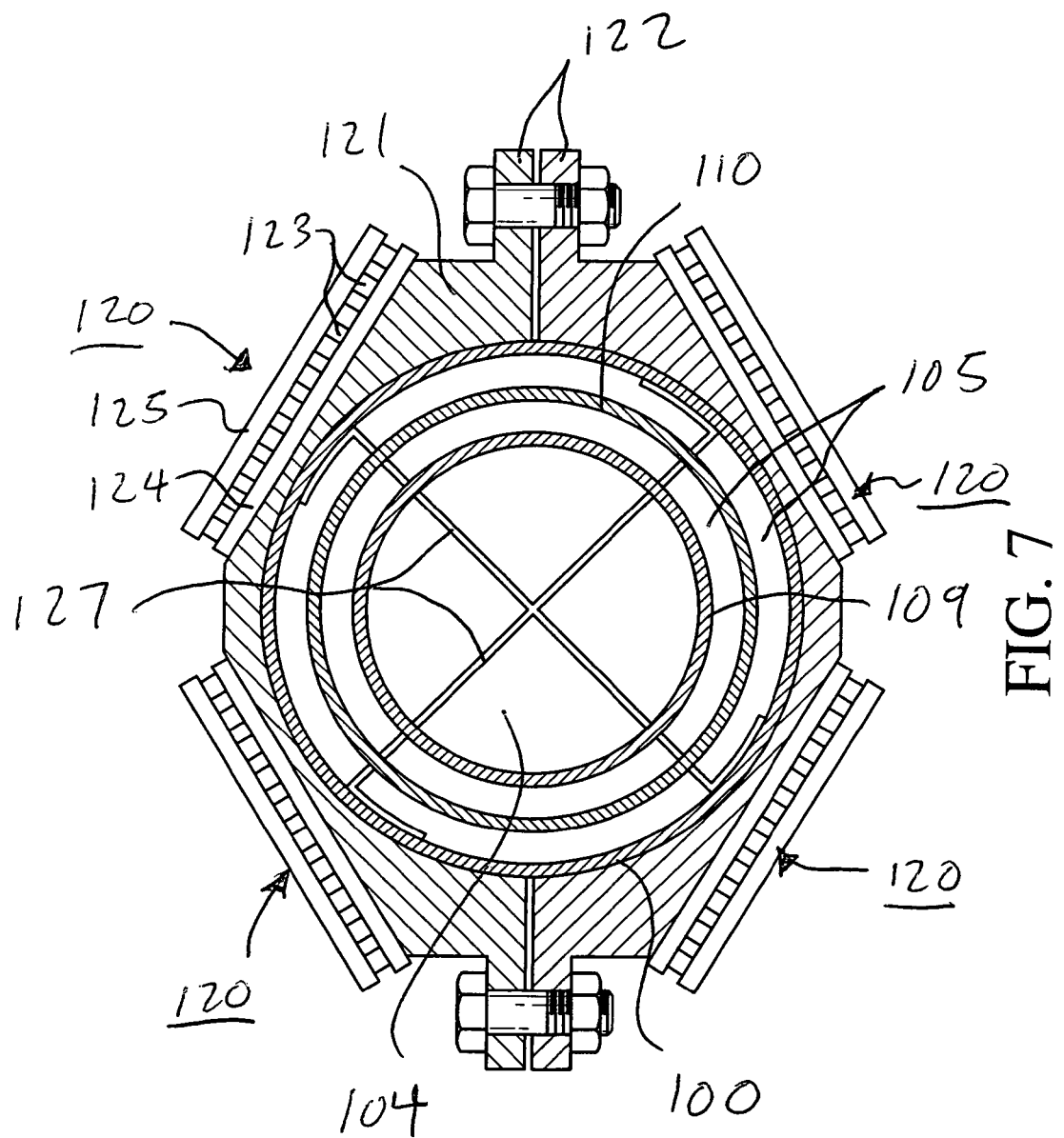
FIG. 7 is a cross-sectional end view of a muffler similar to the muffler illustrated in FIG. 1, but with the addition of thermoelectric generators.

FIGS. 1 and 2 illustrate a flow-through sound-cancelling muffler 100 constructed in accordance with the principles of a first preferred embodiment of the invention. Muffler 100 includes a housing 101 having an inlet 102 and outlet 103, and arranged to form an inner passage 104, an outer passage 105, and a sound cancellation or conversion chamber 106.

Outer passage 105 is situated between the inner passage and an exterior wall of the housing 101, and surrounds the inner passage. In order to provide a difference in path lengths between the inner and outer passages, outer passage 105 has a zigzag shape, i.e., it begins at an opening 108 on the downstream side of the inner passage 104, extends back toward the inlet side of the inner passage along the outside of a cylindrical wall defining the inner passage, and then reverses direction and extends back toward the outlet side of the inner passage along an outer wall of the housing 101, finally opening into or communicating with sound cancellation or conversion chamber 106. The difference in path lengths between exhaust gases directly entering the cancellation or conversion chamber 206 from the inner passage and exhaust gases flowing through the outer passage is equal to one-half the wavelength, or multiples of one-half the wavelength, of sound to be canceled by the muffler. This length is typically on the order of a few inches to a few feet for an internal combustion engine of the type used to power a vehicle. Because of the one-half wavelength difference in path lengths, sound waves exiting the inner and outer passages into the sound cancellation or conversion chamber 106, and having a frequency intended to be canceled, will destructively interfere in the cancellation or conversion chamber and therefore be prevented from exiting the chamber.

In addition to cancellation of sound waves of a particular frequency, the zigzag configuration of the outer passage 106 provides a means by which heat may be extracted from the exhaust stream and conducted to the exterior of the housing 101. Extraction of heat from the exhaust stream has the effect of reducing the volume of sound generated downstream of the muffler due to the loss of energy from the stream. The heat extracted from the exhaust stream may then be used, as described below, to generate electricity, reform fuels, or for other useful purposes.

In order to more efficiently draw exhaust gases through the outer passage, as indicated by arrows A, a Venturi tube 107 is situated at the outlet of the inner tube 104. Exhaust gases accelerated by the Venturi tube into the sound cancellation chamber 106 pulls exhaust gases through the passage 105, thereby substantially increasing the efficiency of heat transfer to the walls of the passage.

The muffler illustrated in FIGS. 1 and 2 is constructed of multiple tubes, as follows: The inner passage 104 is defined by the inside of a tube 109 that terminates at the opening 108. A second tube 110 forms the boundary between the rearwardly extending portion of outer passage 105 and the forwardly extending portion, the outer passage also being defined by the outside surface of tube 109 and the inside surface of the exterior wall of housing 101. Tube 109 terminates in a throat that forms the Venturi tube 107.

FIGS. 3 and 4 show a muffler corresponding to the muffler of FIGS. 1 and 2, but with two stages. As in the muffler of FIGS. 1 and 2, the dual-stage muffler of FIGS. 3 and 4 includes a housing 100, inlet 102, outlet 103, and first stage having first inner and outer passages 104,105, sound cancellation chamber 106, and Venturi tube 107. However, in order to extend the range of frequencies canceled by the muffler, a second stage includes second inner and outer passages 111, 112, Venturi tube 113, and sound cancellation or convergence chamber 114. At least one, and optionally both, of the inner and outer passages 111,112 of the second stage have lengths that are different than lengths of the first inner and outer passages so that path difference between the second inner and outer passages 111,112 results in cancellation of sound having a different wavelength or frequency than is canceled by the first stage including first inner and outer passages 104, 105.

Those skilled in the art will appreciate that the principle of including multiple stages having inner and outer passages with path length differences that are not the same, as illustrated in FIGS. 3 and 4, may be extended to encompass mufflers with three or more stages. The greater then number of stages, the greater the range of frequencies that can be canceled. In addition, the stages may be arranged in series, in parallel, or in any combination of series and parallel connections.

According to the variation of the invention illustrated in FIGS. 5 and 6, the Venturi pressure that draws the exhaust gases through the outer passage of the muffler may be varied by providing a Venturi cone rather than cylinder, and by controlling the angle of the cone. The construction of this embodiment is identical to that illustrated in FIGS. 3 and 4, except that Venturi tubes or nozzles 107 and 112 are replaced by respective cone shaped nozzles 115,116. Those skilled in the art will appreciate that the shape of the Venturi nozzles or cones may also have an effect on sound attenuation due to reflections from the cones, smoothing of exhaust gas flow, and so forth, and further that the nozzles 115 and 116 need not be identical. For example, nozzles 115 and 116 may have different tapers or angles, and either of nozzles 115 and 116 may be omitted or replaced by a cylindrical nozzle corresponding to the ones shown in FIGS. 3 and 4.

FIG. 7 is a cross-sectional end view of a muffler 119 similar to the mufflers illustrated in FIGS. 1-3, but to which thermo-electric generator units 120 have been added. Muffler 119 includes inner and outer passages 104,105 formed by tubes 109 and 110, and a Venturi tube 107 which may be identical to those shown in FIG. 1, and therefore have been given the same reference numerals. In addition, muffler 119 of FIG. 7 includes heat-conducting outer housing or heat sink unit 121 that clamps onto the muffler by means of flanges 122, and that supports the thermo-electric generator units 120. Each of the thermo-electric generator units includes a plurality of thermo-electric generators 123, an inner plate 124, and an outer plate 125. The inner plate of each unit 120 contacts the heat sink 121 while the outer plate contacts a heat-exchanger (not shown) that may be similar to the arrangement illustrated in copending U.S. patent application Ser. No. 11/211,701, the heat sink 121 and heat-exchanger being separated by an insulator (not shown) so as to create a thermal gradient across the thermo-electric generators and thereby cause the thermo-electric generators to generate electricity. The heat-exchanger may be air or liquid cooled, or both.

Thermoelectric generator units suitable for use in connection with the mufflers of the preferred embodiments are described in U.S. Pat. Nos. 6,605,773; 6,172,427; 5,625,245; 4,753,682; and 4,673,863, cited above, although the invention is not to be limited to a particular type of thermoelectric generator. Current thermoelectric generator configurations are capable of generating upwards of 250 W when connected to a typical vehicle exhaust system. The electricity generated by the thermo-electric generators may be used for a variety of purposes, including generation of hydrogen by electrolysis, operation of vehicle accessories, or even to drive a thermo-electric cooler to cool engine intake area, which will be helpful in diesel turbo-charged engines to prevent pre-ignition of hot gases generated by a turbo charger In addition to the thermoelectric generators 120, FIG. 7 illustrates the addition of support brackets 127 for tube 110. The support brackets may serve as vanes to fine tune exhaust flow and/or enhance heat extraction from the exhaust stream, or separate vanes (not shown) may be provided. Those skilled in the art will of appreciate that the illustrated brackets and/or vanes are optional, and that the brackets and vanes may be varied in shape, size, and/or number, or entirely omitted, while structures other than the illustrated brackets or other supports may be used to relatively position tube 110, Venturi nozzle or tube 107, and/or tube 109.

Those skilled in the art will also appreciate that the shape of the inner and outer passages of the above embodiments may be varied in numerous ways to achieve desired acoustic effects, in addition to cancellation of specific frequencies of sound. The acoustic waves generated by the passage of exhaust gases may be modeled by commercially available software that determines the effects of the walls on exhaust streams of various anticipated velocities and volumes, in order to determine the exact dimensions and configuration necessary to obtain an optimal acoustic effect. As a result, the muffler may be adapted to have desired characteristics by simply varying the configuration or dimensions of the passages.

The path lengths necessary to achieve sound cancellation in each of the embodiments of the invention may be calculated as follows (similar calculations may be used for the other sound cancelling embodiments described below): The frequency of sound from the engine depends on the number of cylinders and engine speed. Assuming eight cylinders and two revolutions between firing for each cylinder, the sound frequency F(Hz)=4 Cylinders*RPM/60=RPM/15. For path length L, the path length difference required to achieve cancellation is one-half of the wavelength corresponding to the sound frequency. For sound traveling at speed C of approximately 1000 f/sec:

$$L=C/F=0.5*1000/(RPM/15)=500*15/RPM=7500/RPM.$$

For the muffler of FIG. 1, in which the outer passage has two sections, each of which is a quarter wavelength in length, for a total of one-half wavelength, sound cancellation requires the following sectional lengths: 650 RPM=5.8 feet; 1000 RPM=3.7 feet; 2000 RPM=1.85 feet; 3000 RPM=1.25 feet; and 4000 RPM=0.92 feet. These lengths are certainly achievable within the footprint of a conventional muffler, particularly if the number of sections is increased, as described below in connection with FIGS. 10-13, or if a helical or spiral wrap-around configuration is substituted as described below in connection with FIGS. 14-20. Ultimately, the path length difference depends on the power band of the engine, and therefore the path length differences can range from approximately on the order of 0.1 ft to 10 ft or more depending on the type of engine.

The embodiment illustrated in FIGS. 8 and 9 are similar to the embodiment of FIGS. 5-6, except that an additional sound-cancelling passage 178 is added. Passage 178 is closed to reflect sound waves back to the passage inlet for cancellation, and thus has a minimum length of one-quarter wavelength rather one-half wavelength.

The embodiment illustrated in FIGS. 10 and 11, on the other hand, is similar to the embodiment illustrated in FIGS. 1 and 2, except that the length of the outer passage is doubled by providing additional zigzag sections. In this embodiment, the outer tube is defined by tubes 128 and 129 connected by end walls 130 and 131 at respective opposite ends to the inner tube 109 and to the outer wall of housing 101. Exhaust gases enter the outer passage through an opening at the input end of the muffler, and are drawn from the opposite end by the Venturi effect provided by nozzle 132 at the outlet end of the inner passage. In addition to increasing the length of the outer passage relative to the overall length of the muffler, the addition of zigzag sections to the outer passage also increases the surface area through which heat is extracted and conducted to the exterior wall of the muffler.

Figure 12:
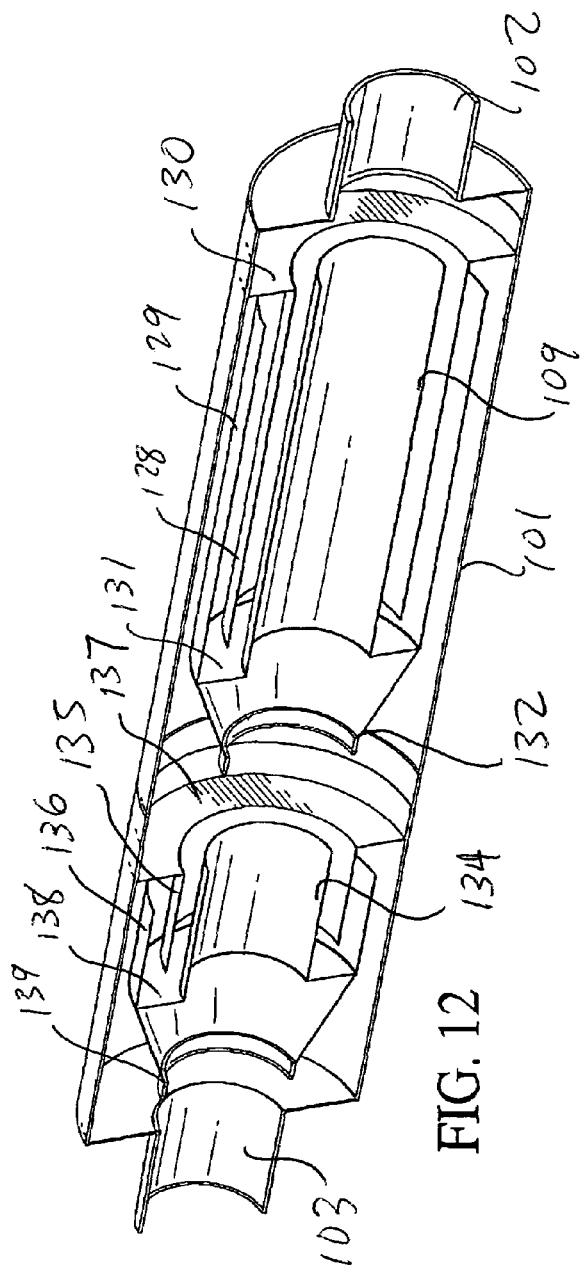
FIG. 12 is a cut-away isometric view of a two-stage version of the muffler of FIGS. 10-11.
Figure 13:
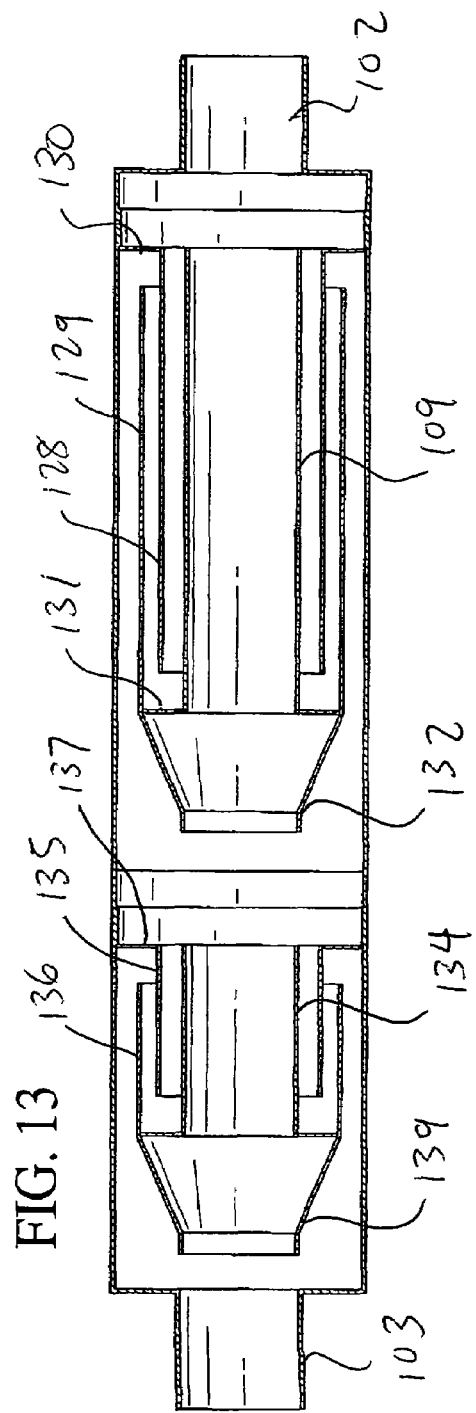
FIG. 13 is a cross-sectional side view of the muffler of FIG. 12.

Different length versions of the sound-cancelling structure of this embodiment can be arranged in series in a manner similar to that shown in FIGS. 12 and 13, which includes tubes 134,135,136, connecting walls 137,138, and Venturi nozzle 139 corresponding to tubes 109,128, 129, connecting walls 130,131, and Venturi nozzle 132 of FIGS. 10 and 11, but with different lengths to cancel different frequencies. Alternatively, the sound-cancelling structures could be arranged in parallel or in a combination of series and parallel connections in order to cancel multiple frequencies.

In the embodiment illustrated in FIGS. 14-15, the zigzag outer passages of FIGS. 1-13 are replaced by a helical outer passage 140 made up of coiled tubing 143 wrapped around the inner passage 145, and having an intake opening 141 on a side of the helical passage adjacent the muffler inlet 102, and an exit opening 142 on a side adjacent the muffler outlet 103. A Venturi cone 144 is situated at the outlet to the inner passage 144 to draw air through the outer passage 140 into the sound cancellation or convergence chamber 145. The length of the outer passage 140 equals one-half wavelength, or multiples of one-half wavelength, of frequencies to be canceled. Alternatively, the tubing can also have a closed end, in which case sound is reflected back to intake opening 141 and a passage length of only one-quarter wavelength is required. In either case, use of a tube or coil has the advantage of low cost and weight, enabling assembly without requiring a lot of welding joints and stamped parts.

Figures 16, 17:
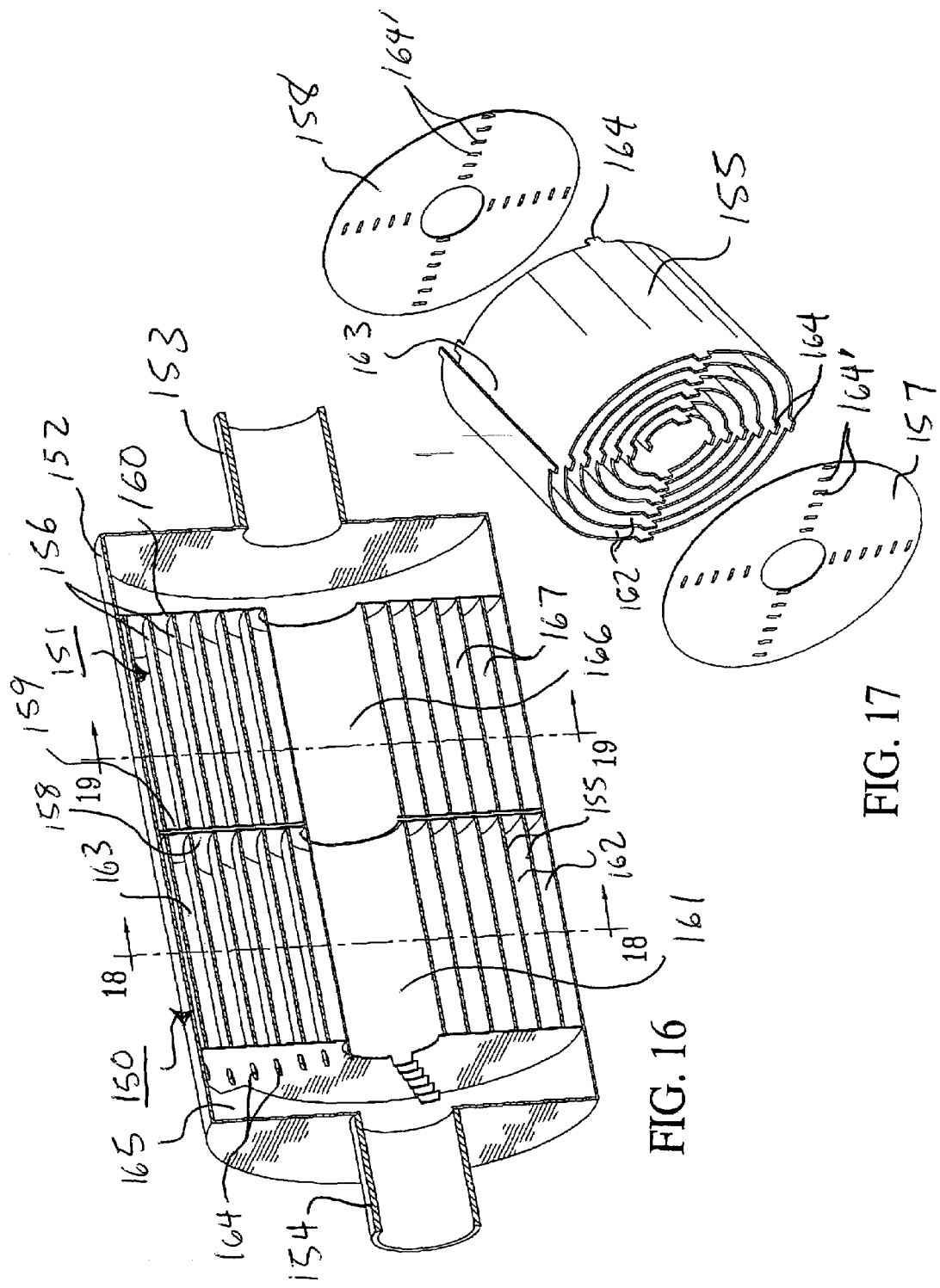
FIG. 16 is a cut-away isometric view of a two-stage muffler in which the outer passage is in the form of a spiral or "jelly roll" construction.
FIG. 17 is an exploded isometric view of a portion of the spiral construction of FIG. 16, having an open distal end.

Of the embodiments illustrated herein, the simplest construction is the "jelly roll" construction shown in FIGS. 16-20. The embodiment illustrated in FIGS. 16-20 includes, as shown in FIG. 16, two sound-canceling units 150,151 situated in a common cylindrical housing 152 having an inlet 153 and an outlet 154 corresponding to the housing, inlets, and outlets of the embodiments of FIGS. 1-15. The two sound canceling units 150,151 include respective coiled sheets or "jelly roll" structures 155,156, and respective end wall pairs 157,158 and 159,160. Although two sound-canceling units are shown, those skilled in the art will appreciate that the muffler may include one sound-canceling unit, or more than two sound-canceling units, depending on the range of frequencies to be canceled.

Figure 18:
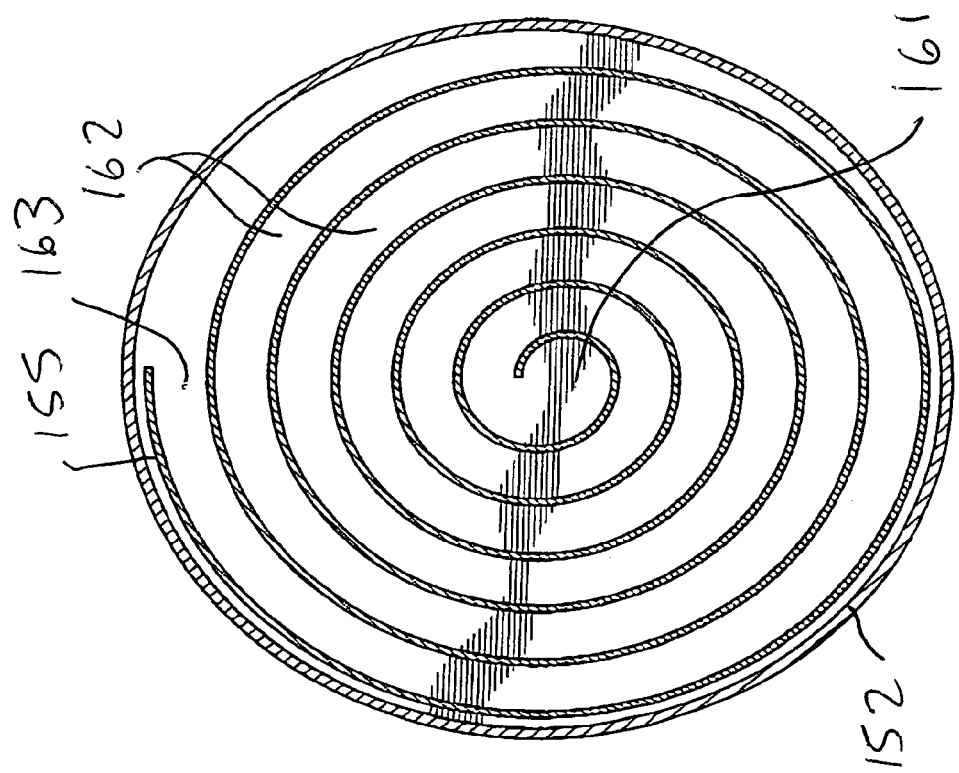

As illustrated in FIGS. 17 and 18, sound canceling unit 150 includes an inner passage 161 formed by the innermost coil of jelly roll structure 155, with the outer passage 162 extending between the coils to an open end 163 at a radially outermost side of the jelly roll. The spacing of the coils is ensured by tabs 164 arranged to fit through slots 164' in the end walls 157 and 158. The length of the spiral outer passage 162 again equals one-half wavelength of sound to be canceled, or multiples of one-half wavelength. However, instead of a Venturi cone drawing exhaust gases from an opening in the inner passage through the outer passage to a convergence chamber as in the embodiment of FIGS. 1-15, the Venturi effect of exhaust gases passing through the inner passage 161 of sound-cancelling unit 150 draws exhaust gases inwardly as sound waves propagate outwardly, the sound exiting the open end 163 destructively interfering with sound exiting the inner passage 161 in a sound canceling or convergence chamber 165.

Figure 19:
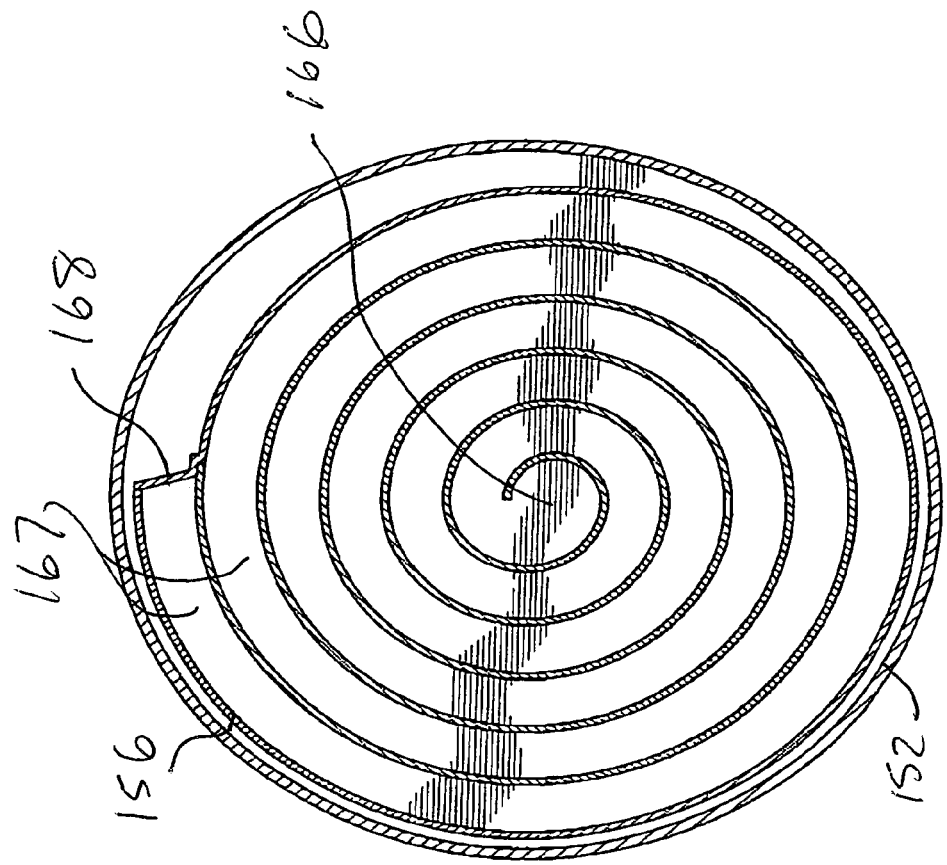
FIGS. 18 and 19 are cross-sectional end views of respective open-ended and closed-ended portions of the spiral construction of FIG. 16.

Sound canceling unit 151 is identical to sound cancelling unit 150 except, as shown in FIG. 19, the jelly roll structure 156 which forms the inner passage 166 outer passage 167 has a closed end 168 at a radially outermost side of the jelly roll. The length of the spiral outer passage 167 equals one-quarter the wavelength of sound to be canceled, or multiples of one-quarter wavelength, with sound reflecting from closed end 168 to destructively interfere with sound in the inner passage 166.

Each of the coiled sheets or jelly roll structures 155,156 is formed by stamping light weight sheet metal and rolling the stamped metal into a coil. A catalyst can be added to the coil for emissions reduction. The tabs 164,169 may be bent over to secure the assembly, although spot welding or other metal joining means could be used to secure the tabs, or as a substitute for the illustrated tabs.

Figure 20:
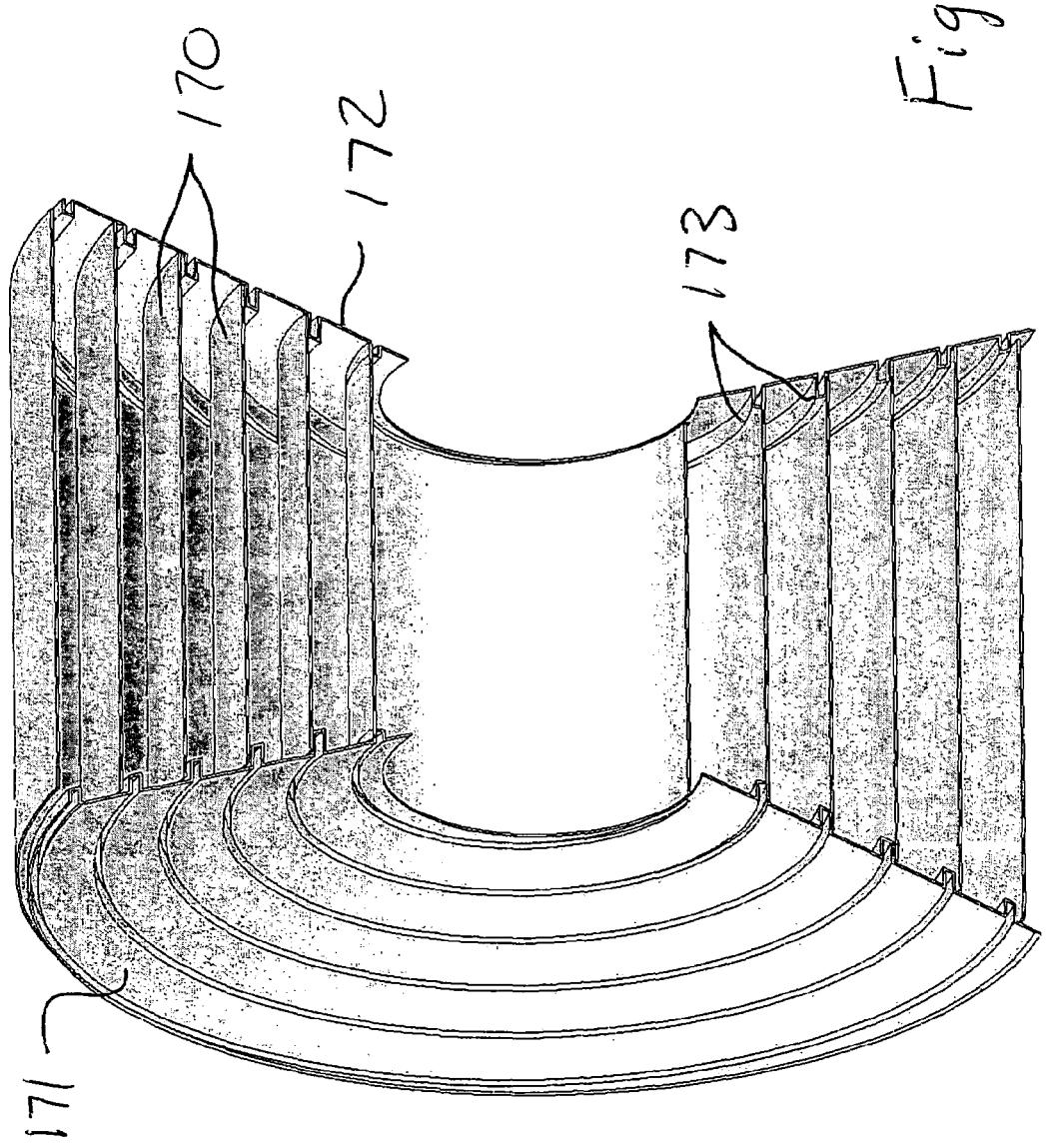
FIG. 20 is an isometric view of a variation of the spiral constructions of FIGS. 16-19, in which a taper is added.

In addition, as illustrated in FIG. 20, the widths of the coils 170 may be tapered to increase with increasing radius of the jelly roll construction and form a spiral volute. The taper simplifies assembly by facilitating alignment of the coiled sheet and end caps 171,172, so that one can simply spot weld the center tapered sheet metal to the center of both end caps, wrap the sheet over a ridged spiral 173 on the end caps, and spot weld the large end of the rolled metal to form an inverted megaphone shape. In addition to simplifying assembly, the taper has the acoustic effect of reflecting back or channeling sound waves from the end caps, thereby compressing the sound waves to help reduce sound.

In the embodiments of FIGS. 9-15, a Venturi cone or nozzle is not required. However, in the case of sound canceling unit 150, a Venturi effect of air passing through the center of the coil pulls air and sound passing outside the coil through opening 162 and cancels the sound at the center of the coil, while extracting heat along the length for the spiral passage. The second closed end coil unit 151 does not extract as much heat because of the lack of air drawn through the coil, but requires only half the coil length to cancel sound of a particular frequency because the sound is reflected back to the inner passage.

The flow-through mufflers of each of FIGS. 1-15 are arranged to be secured to the exhaust system of an internal combustion engine by muffler attachment fixtures that may be the same as those used to connect a conventional muffler to an exhaust system. Although the preferred mufflers may be fitted into the exhaust system of a car or truck, however, they are not limited to automotive applications, but rather may be adapted for any system that emits a stream of exhaust gases, including propulsion systems for vehicles other than cars or trucks, combustion engines other than internal combustion engines, and other sound making devices such as the turret of a tank. The invention is therefore not to be limited to any particular context. Furthermore, the invention is not limited to the cancellation of audible frequencies of 10 Hz to 30 kHz. For example, certain military systems might require damping of inaudible frequencies to avoid detection by the enemy, while naval systems might require damping of frequencies that are audible to wildlife but not humans.

Housing 101 of each of the illustrated embodiments is preferably made of a heat conductive material, and may be cast, formed of a sheet material, or assembled from a combination of cast and non-cast parts joined together by welding, or any other joining means having suitable structural and thermal properties. The greater the length of the inner and outer passages, the greater the area exposed to the exhaust gases and available to transfer heat. In general, formation of the housing 101 from sheets is less expensive than casting, particularly when the material is a heat conductive metal.

In addition to or instead of the thermoelectric generator units 120, a plurality of passages (not shown) which are part of a reformer may be added to utilize the thermal energy extracted from the exhaust stream as part of a hydrocarbon reformer so as to generate hydrogen gas from, by way of example, diesel fuel. Those skilled in the art will appreciate that the reformer of this embodiment may be combined with the flow-through muffler configurations illustrated in any of the above-described FIGS. 1-14, as well as in connection with other flow-through muffler configurations.

Finally, those skilled in the art will appreciate that a catalyst such as platinum may be coated onto any of the heat conducting surfaces of any of the mufflers illustrated in FIGS. 1-15. The inclusion of a catalyst has the effect of reducing pollutants and increasing heat extraction efficiency, thereby forming a combined sound-canceling muffler and catalytic converter.

Having thus described preferred embodiments of the invention in sufficient detail to enable those skilled in the art to make and use the invention, it will nevertheless be appreciated that numerous variations and modifications of the illustrated embodiment may be made without departing from the spirit of the invention. Accordingly, it is intended that the invention not be limited by the above description or accompanying drawings, but that it be defined solely in accordance with the appended claims.

I claim:

1. A flow-through sound-cancelling muffler, comprising:
   a housing;
   a linear inner passage;
   an outer passage situated between said inner passage and an exterior wall of said housing, wherein a difference in length between said outer passage and said inner passage is selected from one-half a wavelength of sound to be canceled by the muffler and a multiple of said one-half wavelength of sound to be canceled by the muffler, said inner passage and said outer passage terminating in a common convergence chamber where sound propagating through exhaust gases in said outer passage destructively interferes with sound propagating through exhaust gases in said inner passage, and wherein said outer passage has walls made of heat conductive material to extract heat from exhaust gases passing through the outer passage and to conduct said heat to an exterior surface of said muffler; wherein said outer surrounds said inner passage;
   and wherein said outer passage has a zig-zag configuration.

2. A flow-through muffler as claimed in claim 1, further comprising at least one thermo-electric generator in contact with said exterior surface, and a heat exchanger for creating a heat differential across said thermo-electric generator.

3. A flow-through muffler as claimed in claim 1, wherein said outer passage extends between an outside wall of said inner passage and a tube extending parallel to the outside wall, and between said tube and an exterior wall of said muffler.

4. A flow-through muffler as claimed in claim 1, wherein said outer passage is formed by a stamped sheet of metal.

5. A flow-through muffler as claimed in claim 1, wherein heat-extraction surfaces of said muffler are coated with a catalyst.

6. A flow-through muffler as claimed in claim 1, further comprising a second sound-canceling unit having a second linear inner passage and a second outer passage extending between said housing and a wall of said inner passage, said second inner and outer passages having lengths that are different than said lengths of said first inner and outer passages to thereby cancel different frequencies of sound.

7. A flow-through sound-cancelling muffler, comprising:
   a housing;
   a linear inner passage;
   an outer passage situated between said inner passage and an exterior wall of said housing, wherein a difference in length between said outer passage and said inner passage is selected from one-quarter a wavelength of sound to be canceled by the muffler and a multiple of said one-quarter wavelength of sound to be canceled by the muffler, sound passage and destructively interfering with sound propagating in said inner passage, and wherein said outer passage has walls made of heat conductive material to extract heat from exhaust gases passing through the outer passage and to conduct said heat to an exterior surface of said muffler; and wherein said outer passage surrounds said inner passage;
   wherein said outer passage has a zig-zag configuration.

8. A flow-through muffler as claimed in claim 7, further comprising at least one thermo-electric generator in contact with said exterior surface, and a heat exchanger for creating a heat differential across said thermo-electric generator.

9. A flow-through muffler as claimed in claim 7, wherein said outer passage extends between an outside wall of said inner passage and a tube extending parallel to the outside wall, and between said tube and an exterior wall of said muffler.

10. A flow-through muffler as claimed in claim 7, wherein said outer passage is formed by a stamped sheet of metal.

11. A flow-through muffler as claimed in claim 7, wherein heat-extraction surfaces of said muffler are coated with a catalyst.

12. A flow-through muffler as claimed in claim 7, further comprising a second sound-canceling unit having a second linear inner passage and a second outer passage extending between said housing and a wall of said inner passage, said second inner and outer passages having lengths that are different than said lengths of said first inner and outer passages to thereby cancel different frequencies of sound.

* * * * *

UNITED STATES PATENT AND TRADEMARK OFFICE
CERTIFICATE OF CORRECTION

PATENT NO.        : 7,600,607 B2                                              Page 1 of 1
APPLICATION NO.   : 11/280174
DATED             : October 13, 2009
INVENTOR(S)       : John Timothy Sullivan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 521 days.

Signed and Sealed this

Fifth Day of October, 2010

David J. Kappos
*Director of the United States Patent and Trademark Office*